(12) United States Patent
Feng

(10) Patent No.: US 6,958,637 B2
(45) Date of Patent: Oct. 25, 2005

(54) SPARK CURRENT CANCELLATION IN CHARGE PUMP OF HIGH SPEED PHASE LOCK LOOP CIRCUIT

(75) Inventor: Kai D. Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,982

(22) Filed: Nov. 12, 2003

(65) Prior Publication Data

US 2005/0099213 A1    May 12, 2005

(51) Int. Cl.[7] .............................................. H03L 7/06
(52) U.S. Cl. .................. 327/157; 327/310; 375/376
(58) Field of Search ............................. 327/147, 148, 327/156, 157, 536, 537; 375/373–376; 331/15–17, 331/DIG. 2

(56) References Cited

U.S. PATENT DOCUMENTS

| | | | |
|---|---|---|---|
| 5,646,563 A | * | 7/1997 | Kuo ............................ 327/157 |
| 5,767,736 A | * | 6/1998 | Lakshmikumar et al. ... 327/536 |
| 5,886,551 A | * | 3/1999 | Narahara ..................... 327/157 |
| 6,107,849 A | * | 8/2000 | Williams et al. ............ 327/157 |
| 6,222,402 B1 | * | 4/2001 | Boerstler et al. ........... 327/157 |
| 6,509,770 B2 | * | 1/2003 | Gossmann et al. ......... 327/157 |
| 6,774,730 B2 | * | 8/2004 | Gasparik ..................... 331/17 |

* cited by examiner

*Primary Examiner*—Minh Nguyen
(74) *Attorney, Agent, or Firm*—Schmeiser, Olsen & Watts; Anthony Canale

(57) ABSTRACT

A structure and associated method to control spark current in a phase lock loop circuit. The phase lock loop circuit includes a voltage controlled oscillator, a phase comparator circuit, and a charge pump circuit. The voltage controlled oscillator is adapted to provide a first signal comprising a first frequency. The phase comparator is adapted to compare the first signal comprising the first frequency to a reference signal comprising a reference frequency. The phase comparator is further adapted to provide a control signal representing a phase difference between the first signal and the reference signal. The charge pump circuit is adapted to receive the control signal and control the voltage controlled oscillator such that a phase of the first signal equals a phase of the reference signal. The charge pump circuit is further adapted to compensate for a spark current resulting from a switching mode of the control signal.

22 Claims, 3 Drawing Sheets

SPARK CURRENT CANCELLATION IN CHARGE PUMP OF HIGH SPEED PHASE LOCK LOOP CIRCUIT

BACKGROUND OF INVENTION

1. Technical Field

The present invention relates to a structure and associated method to remove extra current from a phase lock loop circuit.

2. Related Art

An electrical circuit typically comprises unwanted signals. Unwanted signals may cause the electrical circuit to malfunction. Therefore there exists a need to remove unwanted signals from an electrical circuit.

SUMMARY OF INVENTION

The present invention provides a phase lock loop circuit, comprising:

a voltage controlled oscillator adapted to provide a first signal comprising a first frequency;

a phase comparator adapted to compare the first signal comprising the first frequency to a reference signal comprising a reference frequency, wherein the phase comparator is further adapted to provide a control signal representing a phase difference between the first signal and the reference signal; and a charge pump circuit adapted to receive the control signal and control the voltage controlled oscillator such that a phase of the first signal equals a phase of the reference signal, wherein the charge pump circuit is further adapted to compensate for a spark current resulting from a switching mode of the control signal.

The present invention provides a method, comprising:

providing by a voltage controlled oscillator, a first signal comprising a first frequency;

comparing by a phase comparator, the first signal comprising the first frequency to a reference signal comprising a reference frequency;

providing by the phase comparator, a control signal representing a phase difference between the first signal and the reference signal;

receiving by a charge pump circuit, the control signal;

controlling by the charge pump circuit, the voltage controlled oscillator such that a phase of the first signal is about equal to a phase of the reference signal; and compensating by the charge pump circuit, for a spark current resulting from a switching mode of the control signal.

The present invention advantageously provides a structure and associated method to remove unwanted signals from an electrical circuit.

DETAILED DESCRIPTION

Figure 1:
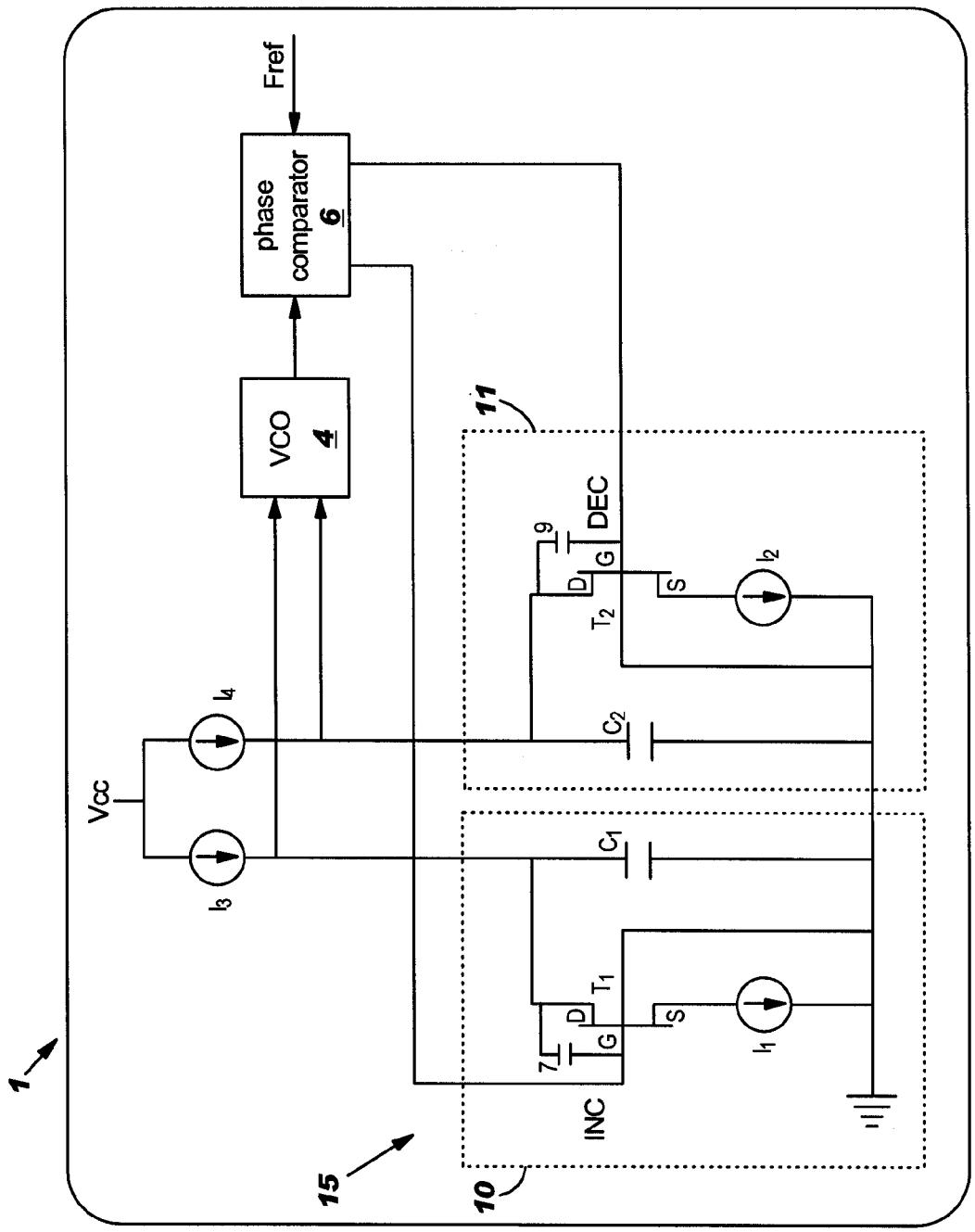
FIG. 1 illustrates a schematic of a differential phase lock loop (PLL) circuit, in accordance with embodiments of the present invention.

FIG. 1 illustrates a schematic of a differential phase lock loop (PLL) circuit 1 comprising a voltage controlled oscillator (VCO) circuit 4, a phase comparator circuit 6, and a charge pump circuit 15, in accordance with embodiments of the present invention. The charge pump circuit 15 comprises a sub-circuit 10 (described in greater detail in the description of FIG. 2) for accepting a positive pulse increase (INC) signal (i.e., a control signal) and a sub-circuit 11 that is equivalent and symmetrical to the sub-circuit 10 for accepting a positive pulse decrease (DEC) signal (i.e., a control signal). A capacitor $C_1$ and a capacitor $C_2$ each comprise a same capacitance value C. A current source $I_1$ and current source $I_2$ are identical and each comprise a constant current value I. The current source $I_1$ determines a discharge current from the capacitor $C_1$. The current source $I_2$ determines a discharge current from the capacitor $C_2$. A current source $I_3$ and a current source $I_4$ are each voltage controlled current sources each comprising a current value that is proportional to the respective common mode voltage of the capacitor $C_1$ and the capacitor $C_2$ (i.e., $(V_{C1}+V_{C2})/2$, $V_{C1}$ is the voltage across the capacitor $C_1$ and $V_{C2}$ is the voltage across the capacitor $C_2$). A N type field effect transistor (NFET) $T_1$ and a N type FET $T_2$ (NFET) are identical FETs. The FET $T_1$ is turned on and off by the positive pulse INC signal. The FET $T_2$ is turned on and off by the positive pulse signal DEC signal. The FET $T_1$ comprises a parasitic capacitance $C_{gd1}$ between the gate G and the drain D. The parasitic capacitance $C_{gd1}$ between the gate G and the drain D of the FET $T_1$ is represented by a capacitor 7. The FET $T_2$ comprises a parasitic capacitance $C_{gd2}$ between the gate G and the drain D. The parasitic capacitance $C_{gd2}$ between the gate G and the drain D of the FET $T_2$ is represented by the capacitor 9. The voltage control oscillator (VCO) 4 comprises a frequency that is proportional to a difference of the voltages across C1 and C2 (i.e., $V_D=V_{C2}-V_{C1}$, $V_D$ is the voltage difference of the voltages across C1 and C2). Fref is an external reference frequency. A phase of the VCO circuit 4 output (i.e., the frequency) is constantly trying to approach a phase of the external reference frequency Fref. The phase comparator 6 generates the positive pulse signals INC and DEC and determines pulse widths according to a phase difference between the VCO circuit 4 output and the external reference frequency Fref. When a phase of the VCO circuit 4 output is behind a phase of the external reference frequency Fref, a pulse width $W_{INC}$ of the positive pulse signal INC is set wider than a pulse width $W_{DEC}$ of the positive pulse signal DEC. When a phase of the VCO circuit 4 output is ahead of a phase of the external reference frequency Fref, the pulse width $W_{DEC}$ of the positive pulse signal DEC is set wider than the pulse width $W_{INC}$ of the positive pulse signal INC. For each pair of pulses of the positive pulse signals INC and DEC, the differential voltage ($V_D$) between $C_I$ and $C_2$ is increased by the following quantity: $I*(W_{INC}-_{DEC})/C$. The VCO circuit 4 changes an output frequency according to $V_D$. A discharge current from $C_I$ and $C_2$ must be equal to the constant current value I. Any extra unwanted current (i.e., spark current in description of FIG. 2 as described infra) that is added to the discharge current may cause the phase error to increase; therefore the phase lock loop circuit 1 may become unstable.

Figure 2:
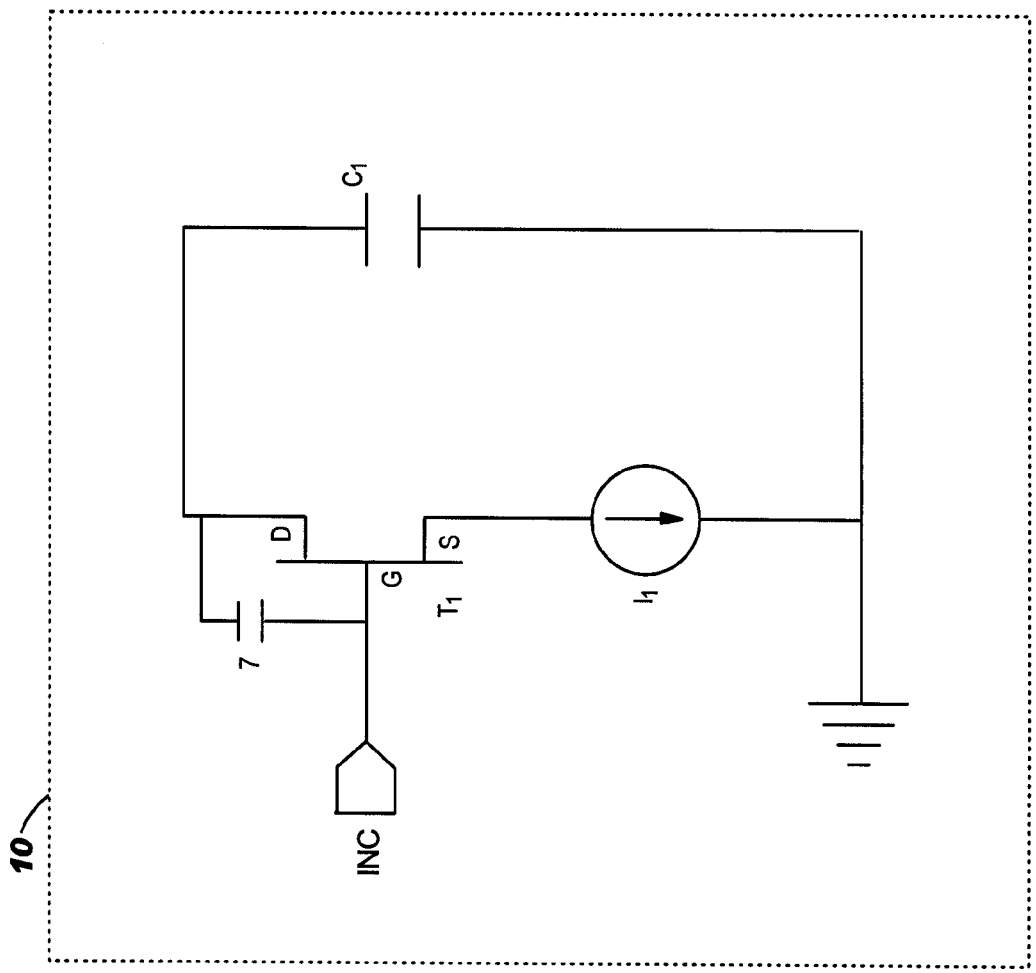
FIG. 2 illustrates the schematic of the sub-circuit within the differential phase lock loop circuit of FIG. 1, in accordance with embodiments of the present invention.

FIG. 2 illustrates the schematic of the sub-circuit 10 for accepting the positive pulse increase (INC) signal of the phase lock loop circuit 1 of FIG. 1, in accordance with embodiments of the present invention. The following description of sub-circuit 10 also applies to the sub-circuit 11 of FIG. 1. The sub-circuit 10 is a discharge circuit in the charge pump circuit 15 of FIG. 1. The sub-circuit 10 comprises the FET $T_1$ electrically coupled to both the current source $I_1$, and the capacitor $C_1$ as described in the description of FIG. 1, supra. The positive pulse signal INC is applied to the gate G of the FET $T_1$. The sub-circuit 10 comprises a basic operation such that when the positive pulse signal INC comprises a logic high, the FET $T_1$ is turned on and the current source $I_1$ discharges the capacitor $C_1$ through the FET $T_1$ The discharging is terminated when the positive pulse signal INC comprises a logic low thereby turning off the FET $T_1$. An average discharge current from the capacitor $C_1$ is dependent upon the current value I, a pulse width $W_{INC}$ of the positive pulse signal INC, and a period of the positive pulse signal INC (i.e., the discharge current from $C_1$=the constant current value I multiplied by an amount of time that it takes for the FET $T_1$ to turn on when the positive pulse signal INC goes from logical low to logical high). The average discharge current from the capacitor $C_1$ is independent of the voltage across the capacitor $C_1(V_{C1})$. In high speed applications for the phase lock loop (PLL) circuit 1, a rise time and a fall time occurring during the transition between logical high and logical low of the positive pulse signal INC are very short. During the rise time and a fall time, the positive pulse signal INC may comprise an extra charge current at the rising edge and an extra discharge current at the falling edge that may be dissipated through the parasitic capacitance $C_{gd1}$ represented by the capacitor 7 and located between the gate G and the drain D of the FET $T_1$. The extra charge current or discharge current is called a spark current. The spark current comprises a very high frequency (e.g., about 10 times higher than a frequency of the discharge current from the capacitor $C_1$). Any spark currents that occur during the rise time and the fall time are not symmetric due to an impedance difference of the FET $T_1$ during the rise time and the fall time. An average spark current value over a period of the positive pulse signal INC does not equal zero and therefore the average spark current value becomes a part of the average discharge current of the capacitor $C_1$ making it difficult to control a discharge of the capacitor $C_1$. A value of the spark current depends upon the capacitance $C_{gd1}$. The capacitance $C_{gd1}$ depends upon the operation mode of the FET $T_1$. The operation mode of the FET $T_1$ is dependent upon on a voltage applied to the drain D (i.e., the voltage across $C_1(V_{C1})$) and the voltage applied to the gate G. Therefore the spark current depends on $V_{C1}$. The spark current is not determined by the current source $I_1$ and therefore the spark current cannot be controlled. Therefore the PLL circuit 1 may malfunction because the spark current may dominate the average discharge current of the capacitor $C_1$. A solution to an elimination of spark current is described in the description of FIG. 3, infra.

Figure 3:
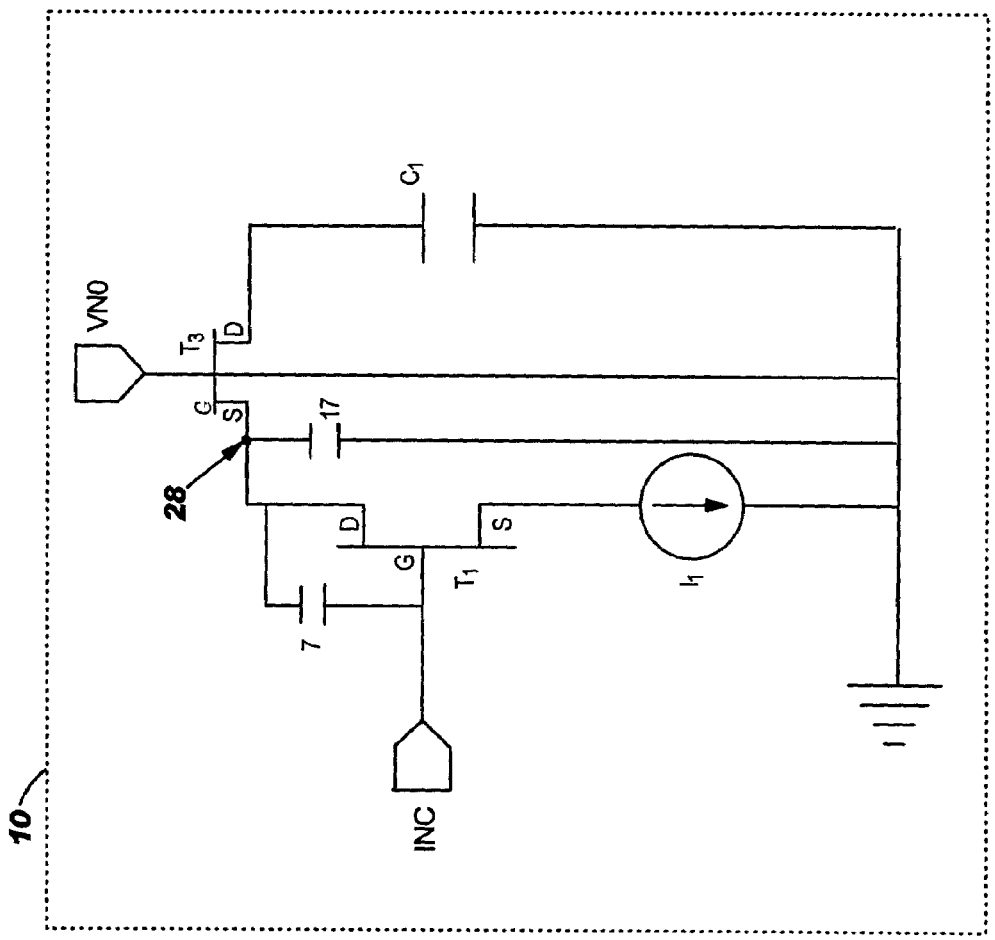
FIG. 3 illustrates a modified schematic for the sub-circuit of FIG. 2, in accordance with embodiments of the present invention.

FIG. 3 illustrates a modified schematic for the sub-circuit 10 of FIG. 2 for accepting the positive pulse increase (INC) signal of the phase lock loop circuit 1 of FIG. 1 and eliminating spark current, in accordance with embodiments of the present invention. The following description of the modified schematic for the sub-circuit 10 also applies to the sub-circuit 11 of FIG. 1. A FET $T_3$ adapted to operate such that the FET $T_3$ comprises a first impedance value between the source S and the drain D is added to the sub-circuit 10 so that the spark current is passed to ground. Likewise, an additional FET adapted to operate in a similar manner as the FET $T_3$ is added to the sub-circuit 11 so that spark current is passed to ground. The FET $T_3$ is an n-channel FET (NFET). The FET $T_3$ is inserted between $T_1$ and $C_1$. A DC voltage VNO is applied to the gate of $T_3$. The DC voltage VNO is selected from a range of voltages that are less than or equal to minimum voltage across the capacitor $C_1(V_{C1min})$ minus a threshold voltage ($V_t$) of the FET $T_3$ (i.e., VNO=$V_{C1min}$-$V_t$) so that the FET operates in saturation mode (i.e., an operating condition of a FET wherein an increase in the source-drain voltage produces no further increase in drain current) and therefore the FET $T_3$ comprises the first impedance value between the source S and the drain D. A size of the FET T should be large enough such that a saturation current of the FET $T_3$ is greater than the current value I (see FIG. 1) of $I_1$. In high speed applications for the phase lock loop (PLL) circuit 1 of FIG. 1, the rise and fall time occurring during the transition between logical high and logical low of the positive pulse signal INC is shorter than the pulse width of the positive pulse signal INC, so the frequency of the spark current is at least ten times higher than a frequency of the discharge current from the current source $I_1$. At the node point 28 between the drain D of the FET $T_1$ and the source S of the FET $T_3$, a parasitic capacitance $C_P$ represented by the parasitic capacitor 17 and the FET $T_3$ operating in saturation mode comprising the first impedance value between the source S and the drain D together form a low pass current filter. The parasitic capacitance $C_P$ presents a path comprising a second impedance value for the spark current (i.e., path for the high frequency spark current) so the spark current is passed to ground through the parasitic capacitor 17. The first impedance value is at least ten times higher than the second impedance value. The first impedance value may be greater than or equal to one megohm. The second impedance value may be less than or equal to one hundred thousand ohms. The low frequency discharge current from the current source $I_1$ goes through the FET $T_3$, the FET $T_1$, and back to the current source $I_1$. Therefore the spark current does not combine with the discharge current of $C_1$.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A phase lock loop circuit, comprising:

a voltage controlled oscillator adapted to provide a first signal comprising a first frequency;

a phase comparator adapted to compare the first signal comprising the first frequency to a reference signal comprising a reference frequency, the phase comparator being further adapted to provide a control signal representing a phase difference between the first signal and the reference signal; and a charge pump circuit comprising, a current source, a first field effect transistor (FET), a second field effect transistor (FET), and a first capacitor, wherein the first FET is electrically coupled to the second FET, wherein the first capacitor is electrically coupled to the second FET, wherein the current source is directly connected to a source on the first FET, wherein the current source is coupled between the source on the first FET and ground, wherein the second FET comprises a parasitic capacitance, wherein the charge pump circuit is adapted to receive the control signal and control the voltage controlled oscillator such that a phase of the first signal equals a phase of the reference signal, wherein the second FET is adapted to be operated such that a spark current resulting from a switching mode of the control signal is directed through the parasitic capacitance to ground and wherein the second FET is adapted to operate in a saturation mode.

2. The phase lock loop circuit of claim 1, wherein a direct current (DC) voltage is applied to the gate of the second FET, wherein the DC voltage is less than a minimum voltage value across the first capacitor minus a threshold voltage of the second FET.

3. The phase lock loop circuit of claim 1, wherein a saturation current value of the second FET is greater that a saturation current value of the current source.

4. The phase lock loop circuit of claim 1, wherein the second FET comprises a first impedance value between the source and the drain, wherein the parasitic capacitor comprises a second impedance value, and wherein the first impedance value is at least ten times higher than the second impedance value.

5. The phase lock loop circuit of claim 4, wherein the first impedance value is at least 1 megohm, and wherein the second impedance value is less than or equal to one hundred thousand ohms.

6. The phase lock loop circuit of claim 1, wherein a frequency of the spark current is at least 10 times higher than a frequency of the current source.

7. The phase lock loop circuit of claim 1, wherein a combination of the parasitic capacitance and the second FET operating in saturation mode form a low pass filter.

8. The phase lock loop circuit of claim 1, wherein the control signal is applied to the base of the first FET, wherein the first FET is adapted to turn on when the control signal comprises a logical high signal, and wherein the first FET is adapted to turn off when the control signal comprises a logical low signal.

9. The phase lock loop circuit of claim 8, wherein said logical high signal comprises a positive pulse increase signal of the phase lock loop circuit, and wherein said logical low signal comprises a positive pulse decrease signal of the phase lock loop circuit.

10. The phase lock loop circuit of claim 8, wherein the spark current occurs during a transition of the control signal between the logical high signal and the logical low signal.

11. The phase lock loop circuit of claim 1, wherein the first FET is an n-channel FET (NFET), and wherein the second FET is an NFET.

12. A method, comprising:
providing a phase lock loop circuit comprising a voltage controlled oscillator, a phase comparator, and a charge pump circuit, wherein the charge pump circuit comprises a current source, a first field effect transistor (FET), a second field effect transistor (FET) and a first capacitor, wherein the first FET is electrically coupled to the second FET, wherein the first capacitor is electrically coupled to the second FET, wherein the current source is directly connected to a source on the first FET, wherein the current source is coupled between the source on the first FET and ground, and wherein the second FET comprises a parasitic capacitance;
providing by the voltage controlled oscillator, a first signal comprising a first frequency;
comparing by the phase comparator, the first signal comprising the first frequency to a reference signal comprising a reference frequency;
providing by the phase comparator, a control signal representing a phase difference between the first signal and the reference signal;
receiving by the charge pump circuit, the control signal;
controlling by the charge pump circuit, the voltage controlled oscillator such that a phase of the first signal is about equal to a phase of the reference signal;
discharging by the current source, the first capacitor through the first FET;
operating the second FET such that a spark current resulting from a switching mode of the control signal is directed through the parasitic capacitance to ground, and operating the second FET in a saturation mode.

13. The method of claim 12, applying a direct current (DC) voltage to the gate of the second FET, wherein the DC voltage is less than a minimum voltage value across the first capacitor minus a threshold voltage of the second FET.

14. The method of claim 13, further comprising forming by the parasitic capacitance and the second FET operating in saturation mode, a low pass filter.

15. The method of claim 12, wherein a saturation current value of the second FET is greater that a saturation current value of the current source.

16. The method of claim 12, wherein the second FET comprises a first impedance value between the source and the drain, wherein the parasitic capacitor comprises a second impedance value, and wherein the first impedance value is at least ten times higher than the second impedance value.

17. The method of claim 16, wherein the first impedance value at least 1 megohm, and wherein the second impedance value is less than or equal to one hundred thousand ohms.

18. The method of claim 12, wherein a frequency of the spark current is at least 10 times higher than a frequency of the current source.

19. The method of claim 12, further comprising applying the control signal to the base of the first FET, wherein the first FET is adapted to turn on when the control signal comprises a logical high signal, and wherein the first FET is adapted to turn off when the control signal comprises a logical low signal.

20. The method of claim 19, wherein said logical high signal comprises a positive pulse increase signal of the phase lock loop circuit, and wherein said logical low signal comprises a positive pulse decrease signal of the phase lock loop circuit.

21. The method of claim 19, further comprising switching between the logical high signal and the logical low signal, wherein the spark current occurs during said switching.

22. The method claim 12, wherein the first FET is an n-channel FET (NFET), and wherein the second FET is an NFET.

\* \* \* \* \*